United States Patent
Brewer

(10) Patent No.: US 8,288,877 B1
(45) Date of Patent: Oct. 16, 2012

(54) ACTUATOR ENHANCED ALIGNMENT OF SELF-ASSEMBLED MICROSTRUCTURES

(75) Inventor: Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 554 days.

(21) Appl. No.: 12/258,408

(22) Filed: Oct. 25, 2008

(51) Int. Cl.
  *H01L 23/544* (2006.01)
(52) U.S. Cl. ............ 257/797; 257/E23.179; 438/401
(58) Field of Classification Search ............ 257/797, 257/E23.179; 438/401, 462
See application file for complete search history.

(56) References Cited

U.S. PATENT DOCUMENTS

| | | | |
|---|---|---|---|
| 4,391,034 A | 7/1983 | Stuby | |
| 5,283,205 A | 2/1994 | Sakamoto | |
| 5,532,520 A | 7/1996 | Haraguchi et al. | |
| 5,545,291 A | 8/1996 | Smith et al. | |
| 5,556,808 A * | 9/1996 | Williams et al. | 438/106 |
| 5,783,856 A | 7/1998 | Smith et al. | |
| 5,859,478 A | 1/1999 | Hagi | |
| 5,904,545 A | 5/1999 | Smith et al. | |
| 6,657,289 B1 | 12/2003 | Craig et al. | |
| 6,946,322 B2 | 9/2005 | Brewer | |
| 7,018,575 B2 | 3/2006 | Brewer et al. | |
| 7,223,635 B1 | 5/2007 | Brewer | |
| 7,253,091 B2 | 8/2007 | Brewer et al. | |
| 7,351,660 B2 | 4/2008 | Brewer et al. | |
| 2003/0174879 A1 | 9/2003 | Chen | |
| 2004/0061200 A1* | 4/2004 | Iwamatsu et al. | 257/620 |
| 2007/0252289 A1 | 11/2007 | Brewer | |
| 2009/0162004 A1* | 6/2009 | Johnson et al. | 385/14 |

OTHER PUBLICATIONS

USPTO Office Action, mailed May 10, 2011 for U.S. Appl. No. 12/258,407, filed Oct. 25, 2008, Inventor Peter D. Brewer.

* cited by examiner

*Primary Examiner* — Tom Thomas
*Assistant Examiner* — Christopher M Roland
(74) *Attorney, Agent, or Firm* — Christopher R. Balzan, Esq.

(57) ABSTRACT

In some embodiments, provided is a microstructure assembly having a capture receptacle, a key, and an actuator associated therewith. The capture receptacle is associated with a substrate and includes alignment projections projecting upward from the base of the capture receptacle. The key is associated with a microstructure device and configured to mate in the capture receptacle, the key has alignment receptacles in a bottom surface of the key constructed to mate with the alignment projections. The actuator is adjacent to the key so as to be capable of contacting the key to trap the key against the capture receptacle.

26 Claims, 3 Drawing Sheets

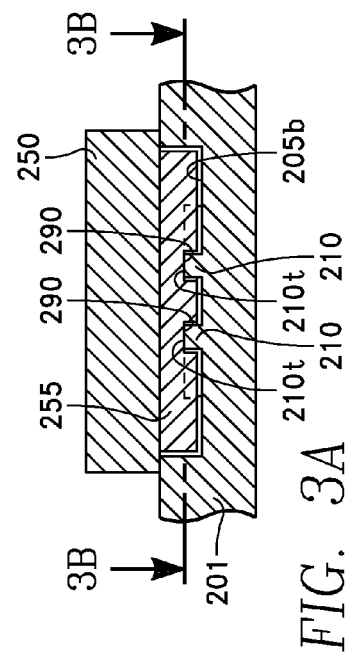
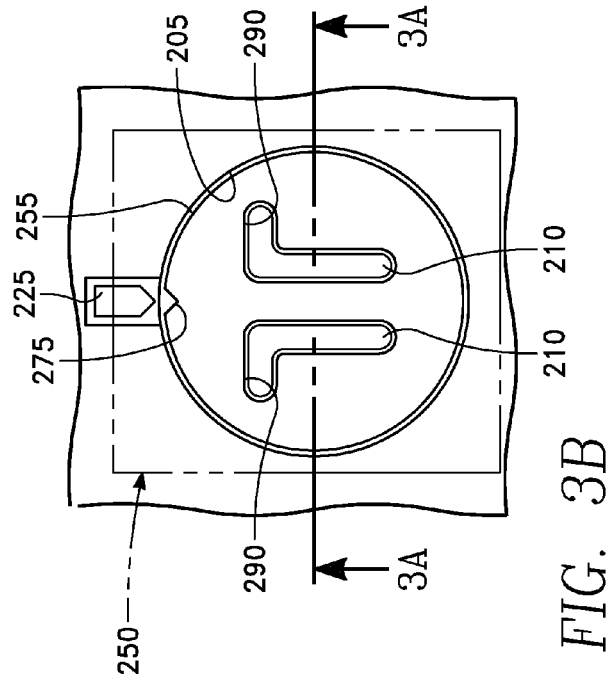
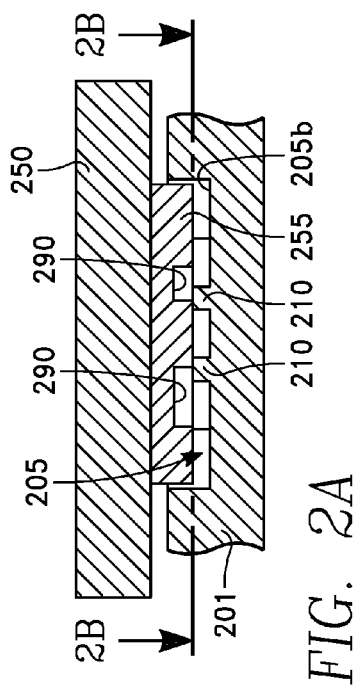
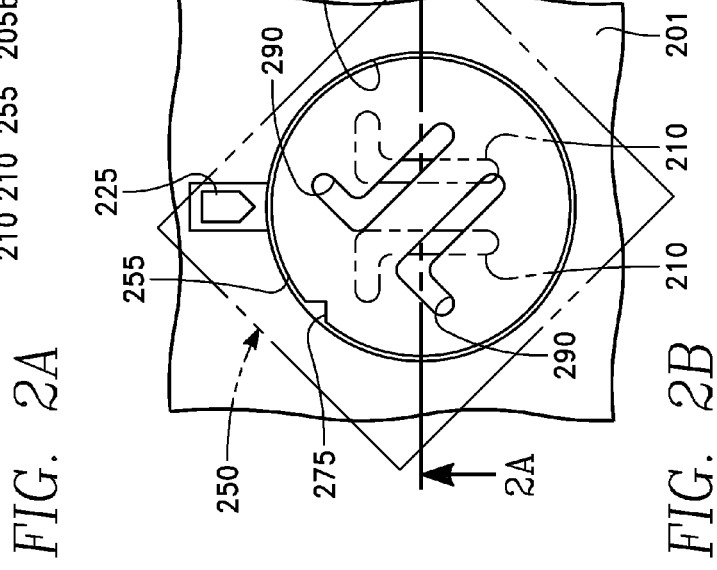

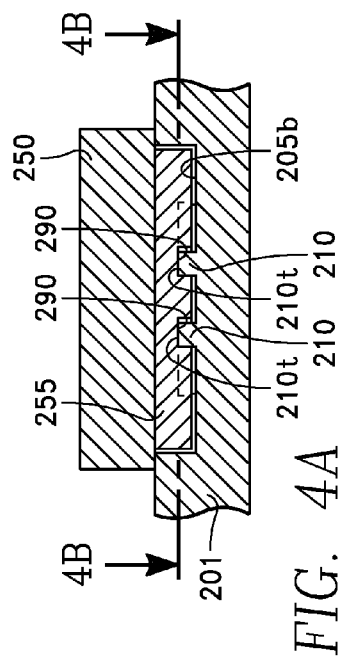
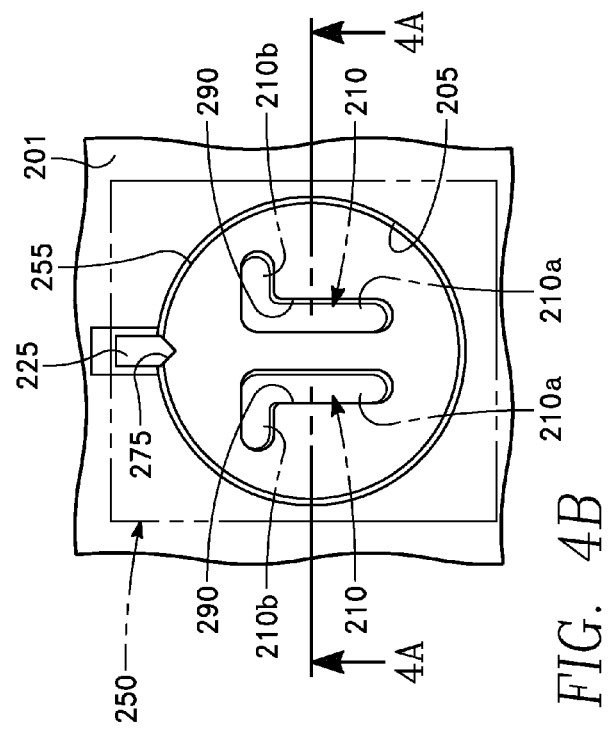
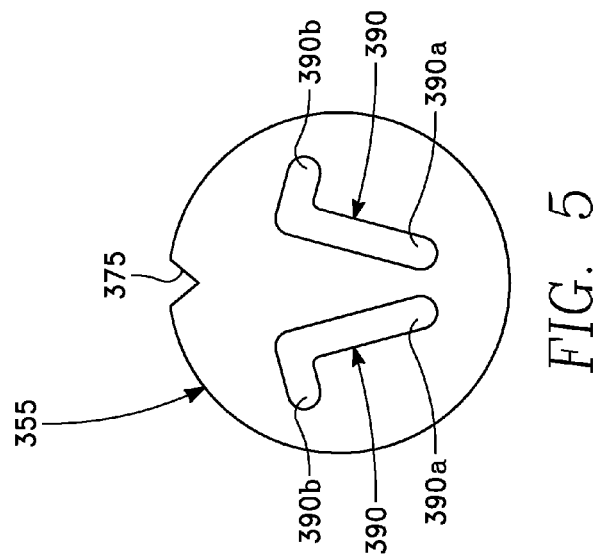

ACTUATOR ENHANCED ALIGNMENT OF SELF-ASSEMBLED MICROSTRUCTURES

CROSS REFERENCE TO RELATED APPLICATION

The present application is related to copending U.S. application Ser. No. 12/258,407 entitled IMPROVED KEY STRUCTURE AND EXPANSION ENHANCED ALIGNMENT OF SELF-ASSEMBLED MICROSTRUCTURES, by Brewer et al., filed on a date even herewith, herein incorporated by reference in its entirety.

BACKGROUND

In wafer scale integrated circuits, separate component chips may be individually integrated with a host wafer using any of several established methods for chip level integration.

The alignment accuracy is a critical parameter in determining the utility of this technology. The accuracy of alignment directly impacts the integration densities, interconnect line widths and pitches, and the ability to fabricate 3D stacks of chips. Furthermore, in cooperative radiating or detecting systems, alignment is critical to the functionality of the system.

To insure proper placement and registration of the microstructures, the microstructures are formed as geometric blocks and recesses are etched from the wafer to provide receptacle sites with geometric profiles that are complementary to the profiles of the blocks. One example is shown in U.S. Pat. No. 5,545,291, by Smith et al., entitled METHOD FOR FABRICATING SELF-ASSEMBLING MICROSTRUCTURES, herein incorporated by reference in its entirety. Fluidic self-assembly may be used to integrate the individual device microstructures into receptacle sites on host electronic circuits using a liquid medium for transport. Placement and registration of the device microstructures into receptacles on a substrate carrying electronic microcircuits is controlled by shape recognition or by selective chemical adhesion or both.

Other examples of microstructure placement techniques and structures include U.S. Pat. No. 7,223,635 by Brewer, entitled ORIENTED SELF-LOCATION OF MICROSTRUCTURES WITH ALIGNMENT STRUCTURES; and U.S. Pat. No. 7,018,575, by Brewer et al., entitled METHOD FOR ASSEMBLY OF COMPLEMENTARY-SHAPED RECEPTACLE SITE AND DEVICE MICROSTRUCTURES; both herein incorporated by reference in their entireties. Further examples may be found in U.S. Pat. Nos. 6,946,322 and 5,783,856, herein incorporated by reference.

SUMMARY

In various embodiments, provided is a microstructure assembly having a capture receptacle, a key, and an actuator associated therewith. The capture receptacle is associated with a substrate and includes alignment projections projecting upward from the base of the capture receptacle. The key is associated with a microstructure device and configured to mate in the capture receptacle, the key has alignment receptacles in a bottom surface of the key constructed to mate with the alignment projections. The actuator is adjacent to the key so as to be capable of contacting the key to trap the key against the capture receptacle.

In various embodiments, a microstructure assembly is provided having a generally circular capture receptacle associated with a substrate, the capture receptacle includes alignment projections projecting upward from a central region of the base of the capture receptacle. A cylindrical key is associated with a microstructure device and configured to mate in the capture receptacle. The key includes alignment receptacles in a bottom surface of the cylindrical key constructed to mate with the alignment projections and an alignment notch located on a periphery of the cylindrical key. An actuator is positioned to be capable of engaging the alignment notch so as to urge the projection receptacles against the alignment projections.

In various embodiments, a microstructure system is provided which includes a capture receptacle associated with a substrate, the capture receptacle having alignment projections projecting upward from the base of the capture receptacle. A key is associated with a microstructure device and is configured to mate in the capture receptacle. The key has alignment receptacles in a bottom surface of the key constructed to mate with the alignment projections. An actuator is located adjacent to the key and is constructed to be capable of engaging the key to trap the key in the receptacle.

BRIEF DESCRIPTION OF THE DRAWINGS

The features and advantages of the present invention will be better understood with regard to the following description, appended claims, and accompanying drawings where:

FIG. 2A is a simplified illustration showing a cross sectional side view of the capture receptacle with a key and associated device, viewed from the 2A-2A line of FIG. 2B.

FIG. 2B is a simplified illustration showing a view along line 2A-2A of FIG. 2A.

FIG. 3A is a simplified illustration showing a cross sectional side view of the capture receptacle with a key and associated device, viewed from the 3A-3A line of FIG. 3B.

FIG. 3B is a simplified illustration showing a view along line 3B-3B of FIG. 3A.

FIG. 4A is a simplified illustration showing a cross sectional side view of the capture receptacle with a key and associated device, viewed from the 4A-4A line of FIG. 4B.

FIG. 4B is a simplified illustration showing a view along line 4B-4B of FIG. 4A.

FIG. 5 is a simplified illustration showing a bottom view of a key of a possible embodiment.

DESCRIPTION

Figure 1A:
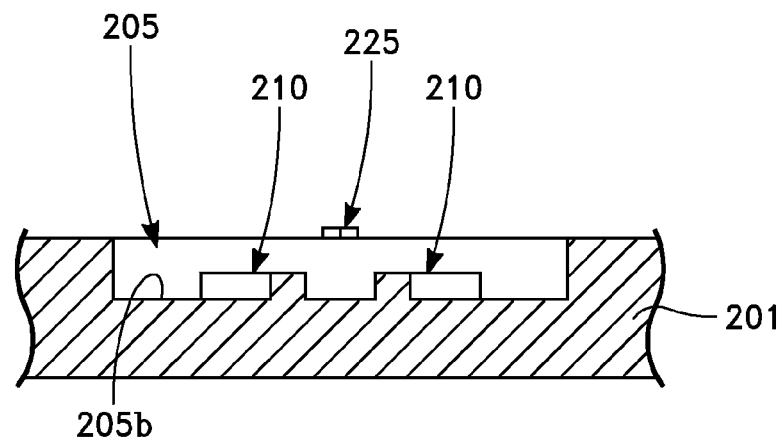
FIG. 1A is a simplified illustration showing cross sectional side view of a capture receptacle in a substrate taken along the 1A-1A line of FIG. 1B.

Self-assembly methods can potentially dramatically lower the costs of electronically steered antennas, mm-wave imaging systems, and MMIC technology. In areas such as phased array antennas, low cost MMIC technology, and millimeter wave imaging, the alignment accuracy of components that are assembled using self-assembly or other techniques such as automated placement, can be critically important. The alignment accuracy is a critical parameter in determining the utility of this technology since it sets the design rules for the integration process. The accuracy of alignment directly impacts the integration densities, interconnect line widths and pitches, and the ability to fabricate 3D stacks of chips.

Precise registration and alignment of a self-assembly structure is difficult to obtain with current systems. Prior U.S. Pat. Nos. 6,946,322, 5,545,291, 5,783,856, and 5,904,545, herein incorporated by reference, describe methods for fabricating self-assembling microstructures. The self-assembling microstructures are material blocks, or device and IC components that are either geometrically shaped or have external alignment keys for assembly and positioning.

In the case of the shaped blocks, these fit into recessed regions of a substrate and become integral with the substrate. The fabrication of the geometrically shaped microstructure utilizes crystallogaphically selective wet-chemical etching to tailor the sidewall profile of the microstructures. It has been realized by the present inventor that this approach has a number of disadvantages including: limited selection of sidewall profiles (difficult to implement for extremely thin device microstructures), poor orientation capability—limited selection of geometric shapes (IC or device design are typically to squares or rectangles), poor use of device and circuit area due to shaping of microstructure, limited applicability to materials that are difficult to etch ($Al_2O_3$, SiC, GaN, etc.), and poor compatibility of etch chemistry to shape the microstructure with fabricated devices and circuits on the microstructure.

In the case of the components with external alignment keys, the alignment accuracy is limited by the mechanical tolerance between the key and the complimentary shaped receptacle. There is a tradeoff between the optimum assembly throughput and the precision of the alignment. Typically, to achieve the highest assembly throughput the mechanical fit must be loose.

Some implementations provide a means for improving the alignment accuracy of keyed device or integrated circuit components that are assembled and positioned in receptacles on a substrate using self-assembly methods (i.e. chip printing or fluidic self-assembly) or other high throughput assembly means (i.e. pick and place). In various implementations and embodiments, improved alignment is desired without compromising the assembly throughput or initial orienting process. Various implementations and embodiments may be utilized to improve assembly and transfer of integrated devices or integrated circuit components on a host circuit, as well as the processes for keying the components and making the complementary receptacle arrays.

To facilitate manufacturing, it is desirable to achieve precise alignment without compromising the assembly throughput, and preferably without significantly changing the orientation process. One way to achieve this is to improve the alignment mechanism of the self-assembled device or IC microstructures with their complementary shaped host receptacles. The improved microstructures ultimately will be transferred and integrated into host circuits.

As described in further detail below, various implementations and embodiments employ components that have alignment key structures and receptacles that are complementary shaped. In one embodiment of the invention, the receptacle is fashioned with an actuating structure that is used to guide the key into a higher degree of alignment. This solves a long-standing problem of how to quickly assemble loosely fitting parts and achieve very high levels of alignment accuracy.

FIGS. 1A-5

Figure 1B:
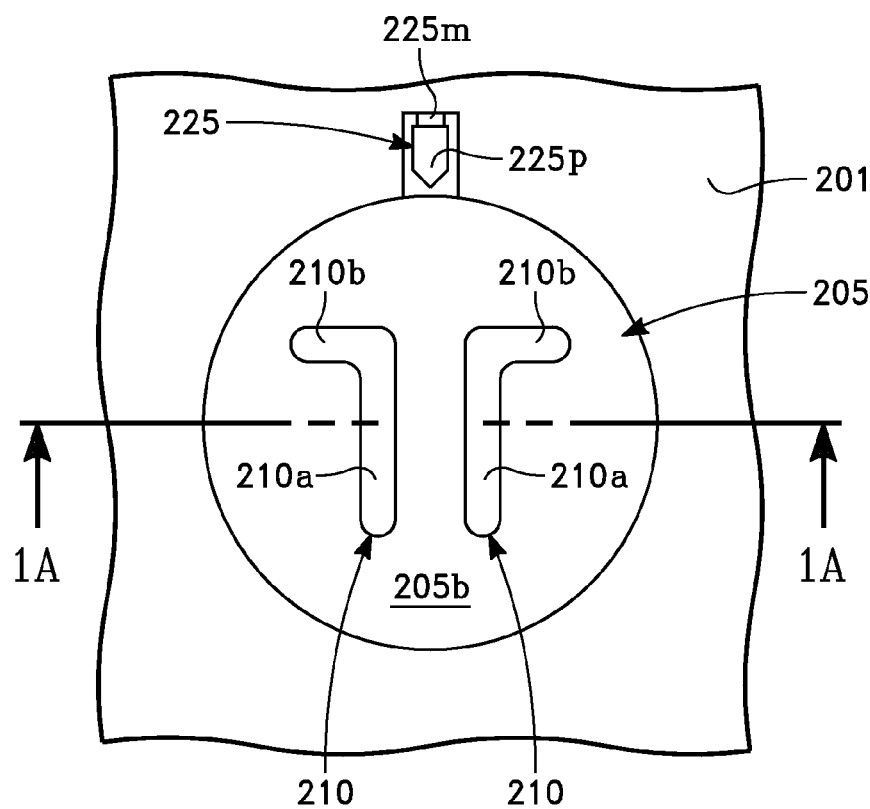
FIG. 1B is a simplified illustration showing a top view of the capture receptacle.

FIG. 1A is a simplified illustration showing cross sectional side view of a capture receptacle 205 in a substrate 201 viewed along the 1A-1A line of FIG. 1B. FIG. 1B is a simplified illustration showing a top view of the capture receptacle 205. In the embodiment of FIGS. 1A & 1B, the capture receptacle 205 is a cylindrical cavity with alignment projections 210 projecting from a base 205b of the capture receptacle 205. As used herein, the term substrate refers to any material in which one or more capture receptacles may be formed. Thus, a substrate as used herein, may be a base material, i.e. a wafer or the like, or, it may be one or more layers on a base material or carrier.

In this embodiment, there are two "L" shaped projections 210 arranged with the long segments 210a of the projections 210 generally parallel so that the projections 210 are symmetric about and axis (not shown) extending between and parallel to the projections 210. In this embodiment, the short segments 210b of the projections extend in opposite directions away from each other and the axis. Thus, the "L" shaped projections 210 are "back-to-back" and spaced apart.

An actuator 225 is associated with the substrate 201 to enhance alignment as discussed below. The actuator 225 may be actuated by thermal, magnetic, electrical, gravitational, or capillary forces. The actuator may be on a top surface of the substrate 201, or contained within a recess in the substrate 201, or in the receptacle 205, in various embodiments.

FIG. 2A is a simplified illustration showing an cross sectional side view of the capture receptacle 205 with a key 255 and associated device 250 from the 2A-2A line of FIG. 2B. FIG. 2B is a simplified illustration of the key 255 in the capture receptacle 205 viewed along the 2B-2B line of FIG. 2A. In FIGS. 2A and 2B, although captured by the capture receptacle 205, the key 255 is not properly oriented within the capture receptacle 205 to allow the projection receptacles 290 (FIG. 2B) to mate with the projections 210.

The circular cross section of the receptacle 205 allows easy capture of the key 255. Orientation of the key 255 is accomplished by engaging the projections 210. The key 255 is captured by the receptacle 205 and oriented until it engages the projections 210, as shown in FIGS. 3A and 3B.

FIG. 3A is a simplified illustration showing an cross sectional side view of the capture receptacle 205 with a key 255 and associated device 250, viewed from the 3A-3A line of FIG. 3B. FIG. 3B is a simplified illustration showing an oriented key 255 in the capture receptacle 205 viewed along the 3B-3B line of FIG. 3A. The mating of the projections 210 with the corresponding projection receptacles 290 fix the orientation of the key, along with the device 250. As the key 255 becomes aligned, it drops into the receptacle 205. This may be done by causing the key to spin, such as by vibrating of the system. Alternatives to vibration include without limitation, asymmetric fluid flow (jet of fluid in one direction on one end of a diameter, opposite direction of fluid flow on the opposite end of a diameter), applying a magnetic field to a key made responsive to magnetic fields, or any other means for causing the key to rotate. The device 250 may seat on the top surface of the substrate 201. In other embodiments, the key 255 may drop to seat in the base 205b of the receptacle 205, or the key 255 may seat on the tops 210t of the projections 210. In this way, in some embodiments, the height of the device 250 can be controlled.

Turning to FIGS. 4A & 4B, FIG. 4A is a simplified illustration showing an cross sectional side view of the capture receptacle 205 with a key 255 and associated device 250 viewed from the 4A-4A line of FIG. 4B. FIG. 4B is a simplified illustration showing alignment of the key 255 in the capture receptacle 205, viewed along the 4B-4B line of FIG. 4A. After the key 255 is oriented, an actuator 225 associated with the capture receptacle 205 engages the key 255 to align the key 255 (and device 250), as shown in FIG. 4B. Prior to actuation, shown in FIGS. 2B and 3B, the actuator 225 may be withdrawn so that it does not interfere with the capture and orientation of the key 255. The capture receptacle 205 may be fitted with an actuator 225 that changes shape or length to guide the key 255 into a high accuracy alignment. The actuator 225 urges the key projection receptacles 290 against the projections 210 and traps the key 255 in the receptacle 205.

The actuator 225 may engage the key 255 in an actuator receptacle 275, shown in FIGS. 2B, 3B, and 4B as a "V" shaped notch in the periphery of the key 255.

The actuator 225 may be, or include, a shape memory alloy, shape memory polymer, or a material that changes dimension or moves through other means, such as but not limited to swelling (solvent uptake, thermal, state change), or application of an additional magnetic or electrical force. The actuator 225 may include an alignment pin that is urged by the expansion of a material from behind, for example. Or, it may be pulled or pushed toward the actuator receptacle 275, with one or more electrodes, a solenoidal means, piezoelectric, piezomagnetic, etc. Shown in FIG. 1B, a controllable expansion material 225m is shown behind the actuator pin 225p to urge the actuator pin 225p forward to engage the key (not shown in FIG. 1B).

In other embodiments (not shown) it may be possible to utilize the actuator 225 and the actuator receptacle 275 as part of the orientation of the key 255, to also function as a coarse alignment projection, or even a fine alignment projection, depending on its location with relation to the receptacle 205.

FIG. 5 is a simplified illustration showing a bottom view of a key 355 of a possible embodiment. In FIG. 5, the long segments 390a of the projection receptacles 390 are non-parallel, i.e. the long segments 390a are slanted with respect to the other. In this configuration, when the actuator (not shown) engages the actuator receptacle 375, the force of the actuator normal to the key 355 will push both legs 390a and 390b of the key 355 more directly against both legs (not shown in FIG. 5) of the corresponding projections (not shown in FIG. 5).

In contrast, in some embodiments in accordance with FIG. 4B, as the actuator 255 slides against the tapered sidewall of the actuator receptacle 275 to a fully seated position within the actuator receptacle 275, the key 255 moves transverse to the actuation direction of the actuator 225, to abut the long legs 290a of the projections 290. The key 255 is guided transversely by the actuator 225. In some embodiments in accordance with FIG. 5, however, the key 355 is guided transversely by the legs 390a and 390b causing less stress to the actuator (not shown in FIG. 5).

Photolithographic methods may be used to fabricate alignment key structures on circuit and device-sized components for shape matching self-assembly. Referring to FIGS. 1A-4B, these "keyed" devices or components 250 may be designed to match corresponding receptacle 205 sites on a patterned assembly template (not shown). The alignment key enables close positioning and orientation of arrays of microstructures without shaping the microstructures themselves. The key 255 structures may be designed for 100 micron sized devices 250.

In one method for fabricating the alignment key 255 structure on small device structures 250, a photoresist process is used. The key 255 fabrication uses a single-step process in which thick SU-8 (a negative photo-epoxy resist) is applied and exposed to pattern the shape of the key 255. After exposure, the SU-8 film is developed, the resulting structure undergoes a final hard-bake process to form the key 255 on the device 250.

Expansion of the material of the key 255 also may be used to pre-align, to assist actuator alignment, or to further refine the actuator alignment of the key 255 within the receptacle 205, as discussed in related application Ser. No. 12/258,407 by the present inventor entitled IMPROVED KEY STRUCTURE AND EXPANSION ENHANCED ALIGNMENT OF SELF-ASSEMBLED MICROSTRUCTURES, filed on a date even herewith, incorporated by reference. As discussed therein, when the key 255 swells within the receptacle 205, it creates a tighter fit, which improves precision. In some implementations, final alignment is achieved by heating the keyed component (not shown) that is oriented in the receptacle 255. The large difference between the thermal expansion coefficients of the SU-8 ($112 \times 10^{-6}$° $C.^{-1}$) key 155 and the silicon ($2.6 \times 10^{-6}$° $C.^{-1}$) receptacle material forms the basis of the enhanced alignment of the positioned components in the receptacles. This difference in the thermal expansion of a factor of approximately 40 allows large dimensional changes to be induced during moderate heating (150° C.). For example, a 1 millimeter key will undergo approximately a 16.8 micron expansion in diameter during a 150 degree Celsius heating, whereas the silicon receptacle will decrease in cross section diameter by approximately 0.4 microns. These dimensional changes are enhancing the alignment of a keyed component (not shown), which is captured and oriented in a receptacle 205, to the receptacle 205 itself.

There are a number of possible mechanisms that can induce changes between the shape of a key 205 and a receptacle 255. These include but are not limited to the following: thermal expansion differences between the key and the receptacle materials, swelling of the key structure by solvent uptake, solvent state change, piezoelectric, piezomagnetic, etc.

In some embodiments, a heating process for either/both types of alignment may be carried out solely for alignment, or as part of a solder process so that the component (not shown) is simultaneously aligned, secured, and electrically connected to a substrate (not shown).

Using an actuator, after capture by the receptacle facilitates greater precision alignment than is otherwise achievable with conventional alignment means. Further, when key spins within the capture receptacle, the design inhibits skewing and/or wedging of the key within the receptacle so that it does not seat cockeyed within the receptacle.

In some embodiments (not shown) it is possible to have the projections extend from the key, with the projection receptacles being recessed within the base 205b of the generally circular capture receptacle 205 expand around protruding "receptacle" projection. In some embodiments (not shown) it is possible to have key material expand around protruding "receptacle" projection.

The example embodiments herein are not intended to be limiting, various configurations and combinations of features are possible. Having described this invention in connection with a number of embodiments, modification will now certainly suggest itself to those skilled in the art. As such, the invention is not limited to the disclosed embodiments, except as required by the appended claims.

What is claimed is:

1. A microstructure assembly comprising:
   a) a capture receptacle associated with a substrate, the capture receptacle comprising alignment projections projecting upward from a base of the capture receptacle;
   b) a key associated with a microstructure device configured to mate in the capture receptacle, the key comprising alignment receptacles in a bottom surface of the key constructed to mate with the alignment projections; and
   c) an actuator adjacent to the key so as to be capable of contacting the key to trap the key against the capture receptacle so that there is substantially no rotation between the key and the capture receptacle so as to improve an alignment of a self assembled device.

2. The assembly of claim 1, wherein the capture receptacle, the key, and the actuator are constructed such the actuator urges projection receptacles against the alignment projections when the actuator contacts the key.

3. The assembly of claim 2, wherein the key further comprises an actuator receptacle, and wherein the actuator is positioned adjacent to the key so as to be capable of engaging the actuator receptacle.

4. The assembly of claim 3, wherein the actuator receptacle is a "V" shaped notch.

5. The assembly of claim 1, wherein the key further comprises an actuator receptacle, and wherein the actuator is positioned adjacent to the key so as to be capable of engaging the actuator receptacle.

6. The assembly of claim 1, wherein the actuator comprises at least one of: a) a shape memory material; b) a dimension changing material; c) an electrostatic device; d) an electromagnetic device; or e) an electromechanical device.

7. The assembly of claim 1, wherein the alignment projections project from a central region of the base of the capture receptacle.

8. The assembly of claim 7, wherein the alignment projections comprise generally perpendicular segments.

9. The assembly of claim 8, wherein each of the alignment projections comprises a short segment connected to a long segment and wherein the long segments of the alignment projections are generally parallel.

10. The assembly of claim 8, wherein each of the alignment projections comprises a short segment connected to a long segment, and wherein the long segments of the alignment projections are slanted with respect to each other.

11. The assembly of claim 1, wherein the key is generally circular and the capture receptacle is generally circular.

12. The assembly of claim 1, wherein the key comprises a material having an expansion coefficient greater than an expansion coefficient of the capture receptacle.

13. The assembly of claim 1, wherein the alignment projections comprise a pair of alignment projections, and wherein each of the pair of alignment projections comprises generally perpendicular segments, and wherein the pair of alignment projections are disposed in mirror image symmetry about a diameter of the receptacle, and wherein the actuator is disposed along the diameter of the receptacle.

14. The assembly of claim 13, wherein the alignment projections comprise a pair of back-to-back "L" shaped projections, and wherein each of the "L" shaped alignment projections comprises a short segment connected to a long segment, and wherein the short segments of the pair of alignment projections are generally perpendicular to a direction of engagement of the actuator such that the actuator traps the key against the short segments of the pair of alignment projections.

15. A microstructure assembly comprising:
a) a generally circular capture receptacle associated with a substrate, the capture receptacle comprising alignment projections projecting upward from a central region of a base of the capture receptacle;
b) a cylindrical key associated with a microstructure device configured to mate in the capture receptacle, the key comprising:
  i) alignment receptacles in a bottom surface of the cylindrical key constructed to mate with the alignment projections; and
  ii) an alignment notch located on a periphery of the cylindrical key; and
c) an actuator positioned to be capable of engaging the alignment notch so as to urge projection receptacles against the alignment projections so that there is substantially no rotation between the key and the capture receptacle so as to improve an alignment of a self assembled device.

16. The assembly of claim 15, wherein the alignment projections comprise generally perpendicular segments.

17. The assembly of claim 16, wherein each of alignment projections comprises a short segment connected to a long segment, and wherein the long segments of the alignment projections are generally parallel.

18. The assembly of claim 16, wherein each of the alignment projections comprises a short segment connected to a long segment, and wherein the long segments of the alignment projections are slanted with respect to each other.

19. The assembly of claim 15, wherein the cylindrical key comprises a material having an expansion coefficient greater than an expansion coefficient of the capture receptacle.

20. The assembly of claim 15, wherein the alignment projections comprise a pair of alignment projections, and wherein each of the pair of alignment projections comprises generally perpendicular segments, and wherein one of the pair of alignment projections has a segment that is parallel with a segment of an other of the pair of alignment projections.

21. The assembly of claim 20, wherein the alignment projections comprise a pair of back-to-back "L" shaped alignment projections, and wherein each of the "L" shaped alignment projections comprises a short segment connected to a long segment, and wherein the short segments of the pair of alignment projections are generally perpendicular to a direction of engagement of the actuator such that the actuator traps the key against the short segments of the pair of alignment projections.

22. A microstructure system comprising:
a) a capture receptacle associated with a substrate, the capture receptacle comprising a pair of alignment projections projecting upward from a base of the capture receptacle, wherein each of the pair of alignment projections comprises generally perpendicular segments, and wherein the pair of alignment projections are disposed in mirror image symmetry about a diameter of the receptacle;
b) a key associated with a microstructure device configured to mate in the capture receptacle, the key comprising alignment receptacles in a bottom surface of the key constructed to mate with the pair of alignment projections; and
c) an actuator adjacent to the key disposed on the diameter of the receptacle and constructed to be capable of engaging the key to trap the key against the pair of alignment projections within the capture receptacle so that there is substantially no rotation between the key and the capture receptacle so as to improve an alignment of a self assembled device.

23. The system of claim 22, wherein the key comprises an alignment notch constructed to receive the actuator so as to align the key within the capture receptacle when contacted by the actuator.

24. The system of claim 23, wherein the alignment notch is configured such that the actuator is capable of urging the key transverse to a direction of engagement of the actuator and in a direction of engagement of the actuator.

25. The system of claim 24, wherein the alignment projections comprise "L" shaped projections.

26. A microstructure assembly comprising:
a) a capture receptacle associated with a substrate, the capture receptacle comprising alignment projections projecting upward from a base of the capture receptacle;
b) a key associated with a microstructure device configured to mate in the capture receptacle, the key comprising alignment receptacles in a bottom surface of the key constructed to mate with the alignment projections; and c) an actuator adjacent to the key so as to be capable of contacting the key to trap the key against the capture receptacle so that there is substantially no rotation between the key and the capture receptacle so as to improve an alignment of an integrated circuit device.

* * * * *